United States Patent
Porch et al.

(10) Patent No.: US 11,294,018 B2
(45) Date of Patent: Apr. 5, 2022

(54) MICROWAVE RESONANCE CAVITY

(71) Applicant: University College Cardiff Consultants Limited, Cardiff (GB)

(72) Inventors: Adrian Porch, Pontypridd (GB); Damien Murphy, Cardiff South Glamorgan (GB)

(73) Assignee: University College Cardiff Consultants Limited, Cardiff (GB)

(*) Notice: Subject to any disclaimer, the term of this patent is extended or adjusted under 35 U.S.C. 154(b) by 20 days.

(21) Appl. No.: 16/644,139

(22) PCT Filed: Aug. 21, 2018

(86) PCT No.: PCT/GB2018/052367
§ 371 (c)(1),
(2) Date: Mar. 3, 2020

(87) PCT Pub. No.: WO2019/048822
PCT Pub. Date: Mar. 14, 2019

(65) Prior Publication Data
US 2020/0241101 A1 Jul. 30, 2020

(30) Foreign Application Priority Data
Sep. 6, 2017 (GB) .................................. 1714350

(51) Int. Cl.
*G01R 33/60* (2006.01)
*G01N 22/00* (2006.01)
(Continued)

(52) U.S. Cl.
CPC ............ *G01R 33/60* (2013.01); *G01N 22/00* (2013.01); *G01N 24/10* (2013.01); *G01R 33/345* (2013.01); *H01P 7/06* (2013.01)

(58) Field of Classification Search
CPC .... G01R 33/345; G01R 33/60; G01R 33/543; G01R 33/5608; G01R 33/5607;
(Continued)

(56) References Cited

U.S. PATENT DOCUMENTS 3,559,043 A  1/1971  Hyde
3,609,520 A  9/1971  Sneed, Jr.
(Continued)

FOREIGN PATENT DOCUMENTS

EP  0665426 A1  8/1995
GB  1228419 A   4/1971
(Continued)

OTHER PUBLICATIONS

Byung-Ki et al., Development of the microwave Hall effect technique using an ESR spectrometer and a network analyser, Measurement Science and Technology, vol. 2, No. 8, Aug. 1991, pp. 770-779.
EPR Accessories: The Solutions for Mutliple-Choice EPR, Experiments, 2011, Retrieved from the Internet on Oct. 12, 2018.https://www.bruker.com/fileadmin/user_upload/8-PDF-Docs/MagneticResonance/EPR_brochures/EPR_accessories.pdf.
(Continued)

*Primary Examiner* — Patrick Assouad
*Assistant Examiner* — Taqi R Nasir
(74) *Attorney, Agent, or Firm* — MLO, a professional corp.

(57) ABSTRACT

Microwave resonance cavities and associated methods and apparatus are described. In one example, a cavity (100) comprises a first and a second input port (102, 104) for inputting microwave radiation at a first and a second frequency respectively. The microwave radiation at the first frequency may be to excite a sample in the cavity whereas the microwave radiation at the second frequency may be to interrogate a sample in the cavity for analysis. The cavity has dimensions such that it resonates at both the first and the second frequency.

22 Claims, 2 Drawing Sheets

(51) Int. Cl.
*G01N 24/10* (2006.01)
*G01R 33/345* (2006.01)
*H01P 7/06* (2006.01)

(58) Field of Classification Search
CPC ............ G01R 33/4828; G01R 33/4835; G01R 33/3415; G01R 33/283; G01R 33/307; G01R 33/50; G01R 2049/085; H01P 7/06; G01V 3/32; E21B 49/08; G01N 24/10; G01N 22/00
See application file for complete search history.

(56) References Cited

U.S. PATENT DOCUMENTS

| | | | | |
|---|---|---|---|---|
| 3,909,713 | A * | 9/1975 | Billeter | G01L 1/255 324/636 |
| 5,296,457 | A | 3/1994 | Cooke et al. | |
| 2009/0009189 | A1 | 1/2009 | Herrmann et al. | |
| 2009/0314086 | A1* | 12/2009 | Djordjevic | B07C 5/366 73/579 |
| 2014/0009159 | A1* | 1/2014 | Vaes | G01R 33/60 324/316 |
| 2014/0021952 | A1* | 1/2014 | Tkach | H01P 7/00 324/316 |
| 2018/0149683 | A1* | 5/2018 | Cooper | G01R 27/26 |
| 2019/0257770 | A1* | 8/2019 | Desmulliez | G01N 22/02 |

FOREIGN PATENT DOCUMENTS

| | | |
|---|---|---|
| GB | 2273986 B | 11/1996 |
| JP | S6091 | 1/1985 |
| JP | H05126928 A | 5/1993 |

OTHER PUBLICATIONS

International Search Report and Written Opinion dated Oct. 29, 2018 for PCT Application No. PCT/GB2018/052367.

Joo et al., In Situ temperature Jump High-Frequency Dynamic Nuclear Polarization Experiments: Enhanced Sensitivity in Liquid-State NMR Spectroscopy, Journal of the American Chemical Society, vol. 128, Jul. 2006, pp. 9428-9432.

Kawakami and Akasaka, Microwave temperature-jump nuclear magnetic resonance system for aqueous solutions, Review of Scientific Instruments vol. 69, Issue 9, Sep. 1998, pp. 3365-3369.

Mailer et al., Crossed TM110 bimodal cavity for measurement of dispersion electron paramagnetic resonance and saturation transfer electron paramagnetic resonance signals for biological materials, Review of Scientific Instruments, vol. 51, No. 12, Dec. 1980, pp. 1714-1721.

Ruuge et al., Aqueous Sample Heating at X- and W-band: Towards a Microwave T-jump EPR Experiment, 45th Rocky Mountain Conference on Analytical Chemistry, Jul. 27-31, 2003, Abstract #125, pp. 73-74.

Search Report dated Feb. 8, 2018 for GB Patent Application No. GB1714350.4.

* cited by examiner

MICROWAVE RESONANCE CAVITY

BACKGROUND

This invention relates to methods and apparatus for performing sample analysis using microwave radiation in a microwave resonance cavity, in particular but not exclusively to a resonant microwave cavity for use in microwave resonance spectroscopy such as electron paramagnetic resonance and nuclear magnetic resonance spectroscopy, other microwave analysis techniques such as microwave absorption by nanoparticles, and to other associated methods of use of such a cavity.

In microwave analysis techniques, a sample may be placed within a microwave cavity and microwave radiation may be introduced into the cavity. The dimensions of the cavity and the frequency of the radiation are selected so as to result in standing waves, or "resonant modes" developing within the cavity.

For example, microwave resonance spectroscopy may be used for studying the properties of materials. Techniques such as electron paramagnetic resonance (EPR) spectroscopy may be used for studying materials with unpaired electrons. Other techniques such as nuclear magnetic resonance (NMR) spectroscopy can be used to study samples containing nuclei with non-zero spin. Both EPR and NMR may be used for example to study the structure and/or chemical environment of molecules.

An EPR signal arises from the presence of an unpaired electron within an external magnetic field. The electron's magnetic moment aligns with the field in either a parallel or antiparallel manner, and each alignment has a different energy. An electron may transfer between the parallel and antiparallel states by emitting or absorbing a photon with energy equal to the difference in energy of the two states. To perform an electron paramagnetic resonance measurement, a sample is exposed to microwave radiation of a fixed frequency and a variable external magnetic field is applied. The difference in energy between the parallel and antiparallel states is proportional to the applied external magnetic field. When the applied external magnetic field results in an energy difference between the two electron states corresponding to the frequency of the applied microwave radiation, there will be a net absorption of microwave energy which can be detected and viewed as a spectrum by sweeping the applied magnetic field. The properties of this spectrum may be used to determine properties of the sample under test.

A NMR signal is similar in some respects to an EPR signal, but arises from nuclear spins, rather than electron spins, with the nuclei absorbing and re-emitting photons. Nuclei which contain an odd number of protons and/or neutrons have a non-zero magnetic moment, which may be aligned parallel to or antiparallel to an applied external magnetic field. As described above for electrons, the nuclei can transfer between these states by emitting or absorbing a photon with energy equal to the difference in energy between the states. The difference in energy between the two states is proportional to the applied external magnetic field, therefore when electromagnetic radiation is applied, there is an absorbance when the frequency of the radiation corresponds to the difference between energy levels. Properties of the sample may be derived from a spectrum from such measurements when the external magnetic field is swept.

A further microwave analysis technique may be used to measure the alignment and/or rotation of magnetic nanoparticles, such as nano-rods in a liquid, when exposed to a magnetic field, and thereby determine the nature of material bonded thereto. When magnetic nano-rods in a liquid are exposed to a magnetic field, the axes of the nano-rods will tend to align along the direction of the applied magnetic field. If electromagnetic radiation passes through the liquid containing the nano-rods, the transmission of the radiation by the sample will vary with the orientation of the nano-rods. This effect is known as the Cotton-Mouton effect.

If the nano-rods are exposed to a time varying magnetic field, such as a rotating magnetic field, the measurements of the change in microwave absorption within a microwave cavity, instead of transmitted radiation as in the Cotton-Mouton effect, can also be used to determine properties of the nano-rods. For example the rate at which nano-rods rotate in a rotating magnetic field may depend on the dimensions or shape of the nano-rods. The rate of rotation may be determined by observing the change in the absorption of applied electromagnetic radiation. Therefore by applying a magnetic field and measuring the microwave absorption, properties of the nano-rods may be determined.

In some examples, the nano-rods may be configured such that they bind with other molecules in a solution. When molecules bind with the nano-rods it can affect their movement in the applied magnetic field. In this way, nano-rods can be used to determine properties of a liquid they are in. In some examples the liquid may comprise biological matter, such as DNA, which may bind to the nano-rods. In these examples the technique may be used to determine the origin of the biological matter, and as such may be used in diagnostics.

SUMMARY

According to a first aspect of the invention, there is provided a microwave resonance cavity comprising a first input port for inputting microwave radiation at a first frequency, the microwave radiation at the first frequency being to excite a sample in the cavity, and further comprising a second input port for inputting microwave radiation at a second frequency, the microwave radiation at the second frequency being radiation to interrogate a sample in the cavity for analysis and wherein the cavity has dimensions such that it resonates at both the first frequency and the second frequency.

The first and second input ports allow microwaves at different frequencies (for example, from two different sources) to be input to the cavity. The frequencies of the input radiation can be selected to be at frequencies of resonant modes of the cavity. Alternatively the dimensions of the cavity may be selected such that the frequencies of its resonant modes are convenient or optimised, for example they may be selected so a resonant mode is at a frequency which can be generated by conventional microwave radiation sources. The power of the radiation input at each port may be different, for example the microwave power input at the first input port may be greater than the power input at the second input port as a higher microwave power may be used to excite a sample than is used to interrogate the sample.

A sample to interrogate using microwave radiation analysis may be placed within the cavity and both excited and analysed, in some examples at least partially concurrently.

In some examples, the excitation caused by the microwave radiation at the first frequency is heating. Heating the sample may allow analysis of the effects of temperature changes on the sample. Spectroscopy measurements of rapid temperature jumps is known is T-jump spectroscopy. T-jump spectroscopy involves rapidly increasing the temperature of a sample and studying any shift in equilibrium and may for example be used to study the kinetics of chemical processes. Conventionally, energy to provide a temperature jump may be supplied by a high voltage discharge or a laser pulse, and then the heated sample may be placed in a chamber for analysis. However, the cavity of the first aspect of the invention allows heating and analysis to be carried out in the same cavity. Furthermore microwave heating can heat a sample uniformly throughout its volume (so called volumetric heating), and can provide more rapid and efficient heating than conventional methods.

Electron paramagnetic resonance spectroscopy may be used in T-jump spectroscopy to study perturbations to kinetics, equilibrium and conformation, especially for chemical processes involving paramagnetic redox states, free radical species, non-innocent ligands or short-lived intermediates.

Microwave cavities may have resonance modes for a plurality of different frequencies of radiation. For example, a conventional rectangular X-band electron paramagnetic resonance cavity with a $TE_{102}$ resonant mode around 9.6 GHz may have a $TE_{101}$ resonant mode at around 7.3 GHz. However, only one mode is generally excited at any one time, and from a single port.

In some examples, the cavity has a sample receiving region and is dimensioned such that the microwave radiation at the first frequency results in a relatively high, for example maximum or approximately maximum, electric field in the sample receiving region and/or the microwave radiation at the second frequency results in a relatively high, for example maximum or approximately maximum, magnetic field in the sample receiving region.

The electric field component may be used to excite a sample in the resonant mode corresponding to the first frequency, therefore it is advantageous to have a high electric field at the sample in the resonance mode corresponding to the first frequency. The magnetic field component may be used for performing microwave radiation absorption analysis, such as microwave spectroscopy, therefore it is advantageous to have a high magnetic field at the sample in the resonance mode corresponding to the second frequency.

In some examples, the cavity has a sample receiving region and is dimensioned such that the microwave radiation at the first frequency results in a low magnetic field in the sample receiving region and/or the microwave radiation at the second frequency results in a low electric field in the sample receiving region. This may be advantageous as the microwave radiation input for performing microwave analysis will not excite the sample, as it is the electric component of the radiation which is responsible for exciting the sample. Therefore analysis measurements may be performed and controlled independently of exciting the sample as the sample can be excited by applying radiation of the first frequency.

The sample receiving region may be along an axis of the cavity, and/or may be located at the centre of the cavity. In some examples the axis of the sample receiving region may be proximal to a minimum of the electric field of the second mode, the axis of the sample receiving region may lie along a minimum of the electric field of the second mode.

In some examples the cavity has a sample receiving region and is dimensioned such that the first frequency results in a $TE_{101}$ resonant mode and the second frequency results in a resonant $TE_{102}$ mode.

In a $TE_{101}$ resonant mode, there is a maximum in the electric field and a minimum in the magnetic field at the centre of the cavity. As described above this property results in a cavity capable of efficiently exciting a sample located at the centre of the cavity.

In a $TE_{102}$ resonant mode, there is a maximum in the magnetic field and a minimum in the electric field at the centre of the cavity which may be a suitable location for the sample under analysis. Such a cavity may therefore have a maximum in the magnetic field component (which is utilised in microwave analysis) which is in the likely sample containing region. Providing a minimum for the electric field reduces excitation of the sample from the $TE_{102}$ resonant node, allowing excitation of the sample to be controlled using radiation in the $TE_{101}$ mode.

The dimensions and shape of the cavity determine the frequencies at which such resonant modes occur. Generally a larger cavity will result in resonant modes of a lower frequency.

In some examples the first input port is proximal to a maximum of the magnetic field of a resonant mode of the microwave radiation at the first frequency and the second input port is proximal to a maximum in the magnetic field of a resonant mode of the microwave radiation at the second frequency. The maximum may be the practical maximum resulting in a cavity, rather than a theoretical maximum.

It may be advantageous to locate the first input port proximal to a maximum in the magnetic field at the first resonant frequency to excite the first resonant mode of the chamber. It may also be advantageous to locate the second input port proximal to a maximum in the magnetic field at the second frequency to excite the second resonant mode of the chamber. As used herein, the term 'proximal' to a maximum of magnetic field should be taken to mean close to a maximum, i.e. in a region of relatively high field strength. For example a maximum in the magnetic field may be located along a central axis of the cavity, however a location of an input which is 'proximal' to the maximum in magnetic field may be a location on a side of the cavity sufficiently close to the maximum to allow effective coupling of the fields. For example, the input port may be at least substantially aligned with the maximum in one dimension (for example, the length, width or height of the cavity).

It is possible to couple to either electric or magnetic fields, however it may be advantageous to locate an input proximal to a maximum in a magnetic field so that the coupling may be adjusted by rotating a coupling loop.

In some examples the second input port is a waveguide for connecting the cavity to a microwave analysis unit. A waveguide can be used to transmit electromagnetic radiation. Waveguides may be designed to transmit waves of a particular frequency, for example a waveguide may have a frequency below which waves are (at least substantially) not transmitted, known as a cut-off frequency of the waveguide. Only waves with a frequency above the cut-off frequency are transmitted by the waveguide. Therefore a waveguide acts as a high pass filter allowing only transmission of waves above a particular frequency.

In some examples the second input port is further configured to receive radiation output by the excited sample. In other words, the second input port may also function as an output, and output radiation to be measured to perform the spectroscopic analysis.

In some examples the waveguide has a lower frequency cut-off frequency which is greater than the first frequency and less than the second frequency. If the cut-off frequency of the waveguide is less than the second frequency then it will transmit radiation of the second frequency. Therefore the waveguide can be used to both input and output radiation of the second frequency (for example, the output radiation which is reflected within the cavity). Radiation of the second frequency may then be used for spectroscopic analysis of a sample. If the cut-off frequency is greater than the first input frequency then the waveguide will not transmit waves of the first frequency. Therefore radiation of the first frequency can be input to the cavity during spectroscopic measurements without interfering with the measurements as the radiation of the first frequency will be filtered by the waveguide. Providing the filter in the form of the waveguide used to deliver radiation allows for a simple and compact apparatus, although other filter apparatus may be provided in other examples.

In some examples the first input port is a coaxial input port. The coupling of the coaxial input port may be adjustable. This may allow the coupling to be adjusted to reduce reflected power.

In some examples the cavity is an elliptic cylinder. An elliptic cylinder may be able to provide a greater difference between the first frequency and the second frequency compared to a rectangular cavity, while maintaining, or even offering improved performance. The greater difference in frequency may increase the ease of filtering to separate radiation at the first and second frequency, for example, using a filter such as a waveguide. An elliptic cylinder cavity may further offer a greater separation between maxima of the electric field of the first mode and the magnetic field of the second mode.

Moreover, a cavity for magnetic resonance spectroscopy (or another microwave analysis technique) may be designed to have a maximum magnetic field (and minimum electric field) substantially at the location of the sample under test. In some examples the sample is placed at the centre of the cavity. It is therefore advantageous to have a minimum electric field far from the centre of the cavity to reduce the effects of the electric field component on the sample, which may result in exciting of a sample. An elliptic cylinder may provide a resonant mode with a maximum magnetic field at the centre of the cavity, with increased distance between the centre of the cavity and a maximum in electric field when compared to a rectangular cavity of comparable dimensions. A cavity with greater separation between the maximum in the electric field of the first mode and the maximum of the magnetic field of the second mode allows greater independent control of the exciting and analysis of the sample.

In some examples the elliptic cylinder is dimensioned such that second frequency is an X-band microwave frequency. In some applications, such as electron paramagnetic resonance spectroscopy, X-band microwave radiation is conventionally used to interrogate a sample for the sake of analysis. Therefore an elliptic cylinder microwave cavity dimensioned such that a resonance suitable for magnetic resonance spectroscopy exists at an X-band frequency will be compatible with conventional microwave spectroscopy equipment.

In some examples the elliptic cylinder comprises a first and second end and the cavity comprises two separable parts, the parts separable in a plane perpendicular to the ends of the elliptic cylinder. In such a design of cavity the current flow in first and second modes is unaffected by the join between the two separable parts (it may be noted that the terminology $TE_{101}$ and $TE_{102}$ is generally not used in the context of elliptical cavities). Therefore in such a design the two parts of the cavity may not be required to be in contact for the cavity to function, which may allow physical access to the sample under test, even during a microwave spectroscopy measurement. This allows inspection or interrogation of the sample by other means, such as visual inspection. This design of cavity also eases maintenance as the cavity may be opened, for example for cleaning, then easily reassembled.

In some examples, a method of performing microwave analysis in a microwave cavity may comprise irradiating a microwave cavity at a first frequency to excite the sample and irradiating the microwave resonance cavity at a second frequency to perform an interrogation of a sample, wherein the steps of irradiating the microwave cavity to excite the sample and irradiating the microwave resonance cavity to perform an interrogation of the sample are carried out at least partially concurrently. By irradiating a sample in a cavity at two frequencies at least partially concurrently, the sample may be excited while interrogating the sample. This may allow a measurement of how the sample responds to a change in temperature. It also provides a means for precisely controlling the heating of the sample.

In some examples the first frequency irradiates the cavity at a mode having a maximum electric field at the location of the sample and the second frequency irradiates the cavity at a mode having a maximum magnetic field at the location of the sample. As described above, a maximum magnetic field at the location of the sample may be desirable for interrogating the sample and a maximum electric field at the location of the sample may be beneficial for exciting the sample.

In some examples performing the microwave analysis comprises measuring an electron paramagnetic resonance spectrum. In such examples the sample may be exposed to an external time varying magnetic field. The interrogating microwave radiation is applied to the cavity and a spectrum is derived when the external magnetic field is swept, wherein the absorbance in the spectrum corresponds to properties of the sample.

In some examples the method further comprises filtering the first frequency from the signal prior to measuring, wherein the filtering comprises passing the radiation through a waveguide which acts as a high pass filter. A waveguide may have a cut-off frequency, below which no (or minimal) radiation is transmitted. The waveguide may be selected such that the second frequency is transmitted by the waveguide and the first frequency is below the cut-off frequency and so is not transmitted by the waveguide. This allows radiation of the first frequency to be supplied to the cavity while interrogating the sample without radiation of the first frequency interfering with the measurements.

In some examples, the analysis is microwave resonance spectroscopy. In some examples the microwave resonance spectroscopy is electron paramagnetic resonance spectroscopy. In other examples the microwave resonance spectroscopy is nuclear magnetic resonance spectroscopy. Microwave resonance spectroscopy may be performed by applying a time varying magnetic field to the sample and exciting the sample in the chamber at the second frequency. A measurement of the variation in microwave absorption may be performed and compared with the applied magnetic field to determine a microwave resonance spectrum. By applying microwaves at the first frequency it is possible to excite the sample, which for example may be useful for heating the sample for performing T-jump spectroscopy, wherein the equilibria of a reaction is studied by rapidly changing the temperature of the sample.

In some examples the method comprises determining a change in absorption of the radiation at the second frequency. The absorption of the radiation by the sample may vary with the application of an alternating magnetic field, and such variations may be determined, which may provide information about the sample. For example in the presence of an external magnetic field the Cotton-Mouton effect may be observed. The Cotton-Mouton effect describes a relative change in the refractive index for certain polarizations of radiation, resulting in a change in transmitted radiation. Substances containing magnetic nanoparticles, such as nano-rods, may display a particularly strong Cotton-Mouton effect.

In some examples the method further comprises applying a rotating magnetic field to the sample and in some such examples the sample comprises magnetic nanoparticles. If a sample contains magnetic particles, a rotating magnetic field may induce motion in the particles. The nanoparticles may be for example magnetic nano-rods, which generally align when exposed to a magnetic field and may rotate when exposed to a rotating magnetic field.

In some examples the method further comprises determining a rate of rotation of nanoparticles in the sample based on the determined change in microwave absorption. The alignment of the nanoparticles may be determined by measuring the absorption of microwave radiation. By observing changes in the microwave absorption, the rate of rotation of the nanoparticles may be determined.

In some examples the method further comprises determining the presence of specific biological matter in a sample based on the rate of rotation of the nanoparticles. The rate of rotation of the nanoparticles may be affected by a number of factors such as the size of the nanoparticles, the shape of the nanoparticles, the viscosity of the liquid, the strength and time dependence of the magnetic field and/or the material of the nanoparticles. The type of nanoparticles may be selected so that they bind to particular chemical or biological compounds. When these chemical or biological compounds are mixed with the liquid containing the nanoparticles they will bind with the nanoparticles which may affect their properties, for example a nanoparticle may experience more drag and therefore rotate slower when bound to another compound compared to when not bound. Therefore by measuring the rate of rotation of the nanoparticles it may be possible to determine whether a particular chemical or biological compound is present.

According to a further aspect of the invention, there is provided a method of performing microwave analysis in a microwave cavity, the method comprising irradiating a microwave cavity at a first frequency to excite the sample and irradiating the microwave resonance cavity at a second frequency to perform an interrogation of a sample. In some examples the method further comprises determining a change in absorption of the radiation at the second frequency and in some examples the method further comprises applying a rotating magnetic field to the sample. The sample may comprise magnetic nanoparticles and the rate of rotation of said nanoparticles may be determined based on the determined change in absorption. In some examples the method further comprises determining the presence of specific biological matter in a sample based on the rate of rotation of the nanoparticles.

According to a further aspect of the invention, there is provided a microwave resonance apparatus comprising a microwave cavity with a first resonance mode at an exciting microwave frequency and a second resonance mode at an interrogating microwave frequency, an interrogation unit comprising an interrogating microwave source, and an exciting microwave source, wherein the interrogating microwave source and the exciting microwave source are configured to excite the cavity at a first and second resonant mode of the cavity.

In some examples the microwave cavity is configured to receive a sample to be measured within the cavity. This allows a sample to be excited while located within the cavity for interrogation. The sample may therefore be excited while performing interrogation.

In some examples the microwave resonance apparatus further comprises a waveguide, the waveguide configured to supply interrogating microwaves from the interrogating microwave source to the microwave cavity. The waveguide may be a waveguide suitable for transmitting X-band microwave radiation. The microwave source may for example use low noise Gunn diode oscillators to generate the microwave radiation, or some other microwave source.

In some examples the interrogation unit further comprises a microwave analysis unit, wherein the waveguide is further to transmit a microwave return signal from the microwave cavity to the microwave analysis unit. For example a microwave analysis unit for use in microwave resonance spectroscopy may provide chemical information such as the density of species and their environment.

In some examples the cavity further comprises a coaxial input port configured to input exciting microwaves from the exciting microwave source to the microwave cavity.

In some examples the microwave resonance apparatus further comprises a magnetic field source. The magnetic field source may provide a magnetic field to aid in interrogation of the sample.

In some examples the magnetic field source in configured to provide a magnetic field for at least one of magnetic resonance spectroscopy or magnetic nanoparticle polarization analysis. A time varying magnetic field may be provided. For example a magnetic field of varying strength may be used for spectroscopy, whereas a rotating magnetic field may be used for magnetic nanoparticle polarization analysis.

The cavity of the apparatus may have any of the features described in the first aspect of the invention. The apparatus may be used to carry out at least one method step as set out above.

In a further aspect of the invention, there is provided a method of performing microwave analysis comprising locating a sample for analysis in a microwave resonance cavity, irradiating the microwave resonance cavity at a first frequency and irradiating the microwave resonance cavity at a second frequency, wherein the radiation at the first frequency is to excite the sample and radiation at the second frequency is for analysis of the sample.

In a further aspect of the invention, there is provided a method of performing microwave analysis comprising locating a sample for analysis in a microwave resonance cavity, irradiating the microwave resonance cavity at a first frequency and irradiating the microwave resonance cavity at a second frequency, wherein the radiation at the first frequency has a maximum electric field at the location of the sample and the radiation at the second frequency has a maximum magnetic field at the location of the sample. The electric field component may excite the sample, for example it may heat the sample. Therefore it is advantageous for the electric field component to be maximised at the location of the sample when exciting the sample. The magnetic field is used for analysis of the sample and it is therefore advantageous for it to be maximised at the location of the sample when radiation at the second frequency is applied.

In some examples the sample remains within the cavity for both excitation by radiation at the first frequency and analysis by radiation at the second frequency. As the same cavity is irradiated to provide both excitation and analysis, there is no requirement for the sample to be removed from the cavity. Therefore the sample can remain in the cavity for both irradiations improving convenience, time and efficiency of the excitation and analysis.

In some examples the method further comprises applying an external time varying magnetic field to the sample and the sample comprises magnetic nanoparticles. The magnetic field may be a time varying field to induce a rotation in the nanoparticles in the sample. In some examples the method further comprises measuring an absorption of microwave radiation at the second frequency and may further comprise determining a property of the sample based on the measured absorption at the second frequency.

In some examples the sample comprises nanoparticles and the method further comprises using the change in absorption of microwave radiation at the second frequency to determine the rate of rotation of nanoparticles in the sample. In some examples, the method may comprise determining the presence of specific biological matter in a sample based on the rate of rotation of the nanoparticles.

Features described in relation to one aspect of the invention may be combined with those of other aspects of the invention. For example, features described in relation to one method aspect may be combined with another method aspect, or may be performed by an apparatus.

BRIEF DESCRIPTION OF THE DRAWINGS

Non-limiting examples will now be described with reference to the accompanying drawings, in which.

DETAILED DESCRIPTION

Figure 1:
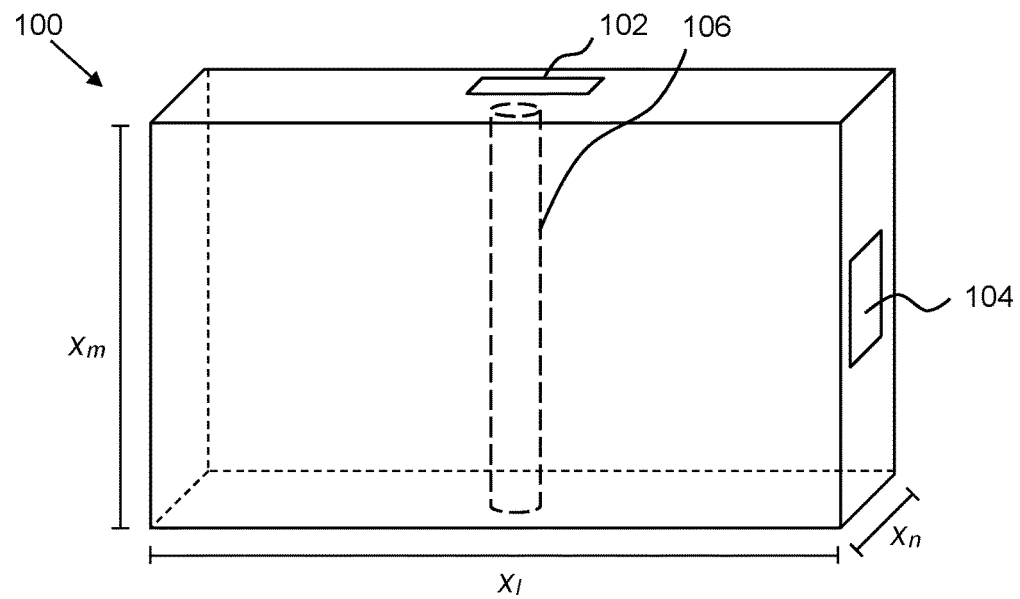
FIG. 1 is a schematic diagram of a microwave resonance cavity.

FIG. 1 shows a microwave resonance cavity 100. The microwave resonance cavity comprises a first input port 102 for inputting microwave radiation at a first frequency. The microwave resonance cavity also comprises a second input port 104 for inputting radiation at a second frequency. The radiation at the first frequency is to excite a sample 106 in the cavity 100 and the radiation at the second frequency is for analysis of the sample 106. The cavity 100 has dimensions $x_m$, $x_n$, $x_l$ such that it resonates at both the first and second frequency.

In this example, the cavity 100 is configured such that it has a sample receiving region 106, for example, as shown in the Figure in dotted outline as it does not comprise part of the cavity 100, a glass walled tube, such a NMR tube. The sample receiving region 106 is shown here as a vertically orientated cylinder parallel to the $x_m$ dimension, however in other examples the region may be orientated in other directions, for example parallel to the $x_n$ dimension, or indeed there may be more than one sample receiving region, each having a different orientation.

As shown in FIG. 1, the cavity 100 has dimensions $x_m$, $x_n$, $x_l$. In this example, the cavity 100 is dimensioned such that the microwave radiation at the first frequency results in a high electric field in the sample receiving region and radiation at the second frequency results in a high magnetic field in the sample receiving region. The shape and dimensions of the cavity 100 will determine the frequency of its resonant modes.

In this example, the dimensions of the cavity 100 are selected such that the first frequency corresponds to a $TE_{101}$ resonant mode of the cavity 100 and the second frequency corresponds to a $TE_{102}$ resonant mode of the cavity 100, as described in more detail with respect to FIGS. 2A-D.

FIG. 1 shows the first input port 102 and second input port 104. The input ports 102, 104 may be any type of input port. For example they may be waveguide input ports or may be coaxial input ports, and/or may receive waveguide or coaxial cables. The input ports may be different types of input ports, for example the first input port may be a coaxial input port and the second input port may be a waveguide input port. The location of the ports 102, 104 may be selected to provide energy transfer at a particular resonant mode of the chamber.

The cavity is constructed from any suitable material, for example a highly conducting metal, which may be selected to have a low concentration of magnetic impurities, such as aluminium, copper or silver. The cavity may be constructed primarily from a first material and coated with a second material. The second material may be a metal such as silver, which is a desirable material to use due to its physical properties, however its high cost means it may be impractical to use in the construction of the whole chamber. Alternatively the whole chamber can be constructed from a material such as aluminium which provides adequate performance, lower cost and is relatively easy to machine.

The cavity 100 shown in FIG. 1 is a rectangular cavity, but the cavity may be other shapes, for example the cavity may have a square or circular cross section. In some examples the cavity has an elliptical cross section, as described in more detail with reference to FIG. 3. Although not shown, the cavity 100 may have an opening, or comprise a lid, or be fabricated as separable parts or the like, to allow a sample to be inserted and removed.

The resonant frequencies of a $TE_{mnl}$ mode of a rectangular microwave cavity are determined by the following equation:

$$f_{mnl} = \frac{c}{2\sqrt{\mu_r \epsilon_r}} \sqrt{\left(\frac{m}{x_m}\right)^2 + \left(\frac{n}{x_n}\right)^2 + \left(\frac{l}{x_l}\right)^2}$$

where $f_{mnl}$ is the frequency of the $TE_{mnl}$ mode, $\mu_r$ and $\epsilon_r$ are the relative permeability and permittivity of the cavity respectively, m, n, and l are integers, and $x_m$, $x_n$ and $x_l$ are the dimensions of the cavity.

In some examples, radiation used in microwave resonance spectroscopy may be in a frequency band of around 8-12 GHz (so-called 'X-band' radiation). The dimensions of the cavity may be selected such that a resonant mode results in a maximum in the magnetic field at the centre of the cavity where a sample under test is located. For example, this may be a so-called $TE_{102}$ resonance mode of a rectangular cavity.

This is a desirable configuration as, as noted above, it is the magnetic component of the radiation which is used to perform the electron paramagnetic resonance measurements.

FIGS. 2A-D shows plots of the magnitude of the magnetic and electric fields in a rectangular cavity such as the rectangular cavity 100 shown in FIG. 1 in the $TE_{101}$ and $TE_{102}$ resonant modes. In these figures lighter shades correspond to higher field strength and darker shades correspond to lower field strength.

Figure 2A:
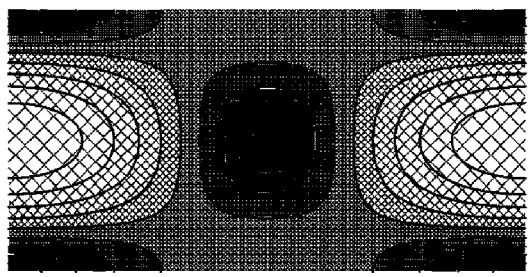
FIG. 2A is a plot of the magnetic field strength of a $TE_{101}$ resonance mode.
Figure 2B:
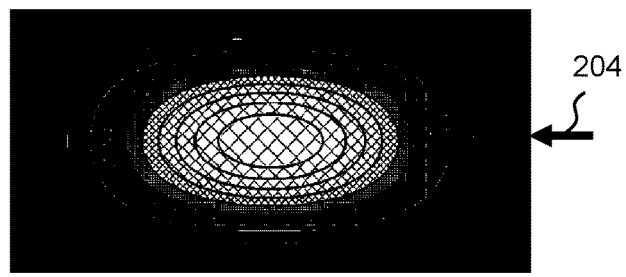
FIG. 2B is a plot of the electric field strength of a $TE_{101}$ resonance mode.

FIG. 2A shows the magnetic field magnitude in the $TE_{101}$ resonant mode and FIG. 2B shows the electric field magnitude in the $TE_{101}$ resonant mode. Microwave radiation at the first frequency may be used to excite the $TE_{101}$ resonant mode. As can be seen from FIGS. 2A and 2B the magnetic field is at a minimum and the electric field is at a maximum at the centre of the cavity in this mode. The electric field component of the radiation may be used to excite a sample 106, therefore if a sample 106 is located at the centre of the cavity and the cavity is irradiated with radiation at the first frequency the sample 106 will be excited. It can be seen in FIG. 2B the $TE_{101}$ resonance provides a relatively uniform electric field at the centre of the cavity. This feature results in a mode particularly well suited for exciting samples as it will provide uniform excitation throughout the sample.

Figure 2C:
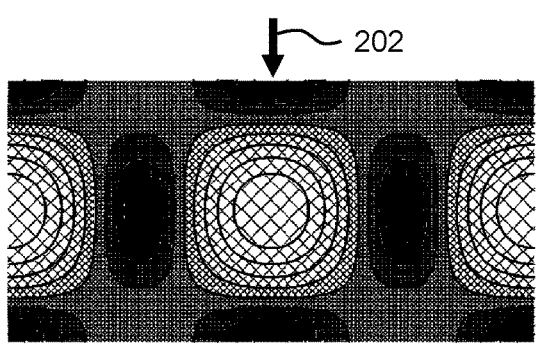
FIG. 2C is a plot of the magnetic field strength of a $TE_{102}$ resonance mode.
Figure 2D:
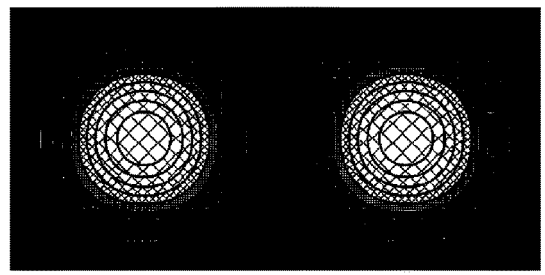
FIG. 2D is a plot of the electric field strength of a $TE_{102}$ resonance mode.

FIG. 2C shows the magnetic field magnitude in the $TE_{102}$ resonant mode and FIG. 2D shows the electric field magnitude in the $TE_{102}$ resonant mode. Microwave radiation at the second frequency may be used to excite the $TE_{102}$ resonant mode. As can be seen from FIGS. 2C and 2D the magnetic field is at a maximum (FIG. 2C) and the electric field is at a minimum (FIG. 2D) at the centre of the cavity in this mode. The magnetic field component of the radiation may be used for analysis, or interrogation, of the sample 106. Therefore if the sample 106 is located at the centre of the cavity and the cavity is excited with radiation at the second frequency, the sample 106 may be interrogated using any of a number of different microwave absorption analysis techniques. For example the sample may be interrogated using a microwave resonance spectroscopy technique such as electron paramagnetic resonance spectroscopy or nuclear magnetic resonance spectroscopy. In other examples the sample may be interrogated using a magnetic nanoparticle polarization analysis technique.

The input ports 102, 104 may be located to enhance transfer of radiation to the cavity. They may be located to be proximal to a maximum of the magnetic field in a particular mode. For example the first input port may be located proximal to a maximum in the magnetic field at the resonant mode at the first frequency 202 and the second input port may be located proximal to a maximum in the magnetic field at the resonant mode at the second frequency 204. As used herein, the term 'proximal to' a maximum of magnetic field is used to a position along an axis. For example a maximum in the magnetic field may be located along a central axis of the cavity, however a location proximal to the maximum in magnetic field may be a location on a side of the cavity sufficiently close, for example substantially aligned with, the maximum so as to allow effective coupling of the fields.

Considering some example dimensions for the cavity 100, this may have dimensions of approximately $x_m$=5.5 cm and $x_l$=2.9 cm ($x_n$ is unconstrained for the sake of determining $TE_{101}$ and $TE_{102}$), in which case, the $TE_{101}$ mode may be excited by radiation at 7.3 GHz and $TE_{102}$ mode may be excited by radiation at 9.6 GHz. A cavity with dimensions $x_m$=35.6 mm, $x_l$=33.6 mm may have $TE_{101}$ and $TE_{102}$ resonant modes at approximately $f_{101}$=6.2 GHz and $f_{102}$=9.6 GHz. The cavity may have dimension $x_n$≈10 mm, however the value of this dimension will not affect the resonant frequencies of interest.

This lower frequency mode could not generally be excited using an example X-band radiation source (for example having an operational range of 9.1-9.9 GHz within the X-band range of around 8-12 GHz), the low frequency mode is never encountered. According to the present invention, this mode may be excited by specifically providing microwave radiation at a first frequency of 7.3 GHz, which results in heating of the sample. A filter may be used to filter this radiation such that it is prevented from being transmitted to analysis apparatus.

In other examples, different resonant modes may be excited, and/or the cavity may have dimensions to result in modes having different frequencies.

Figure 3:
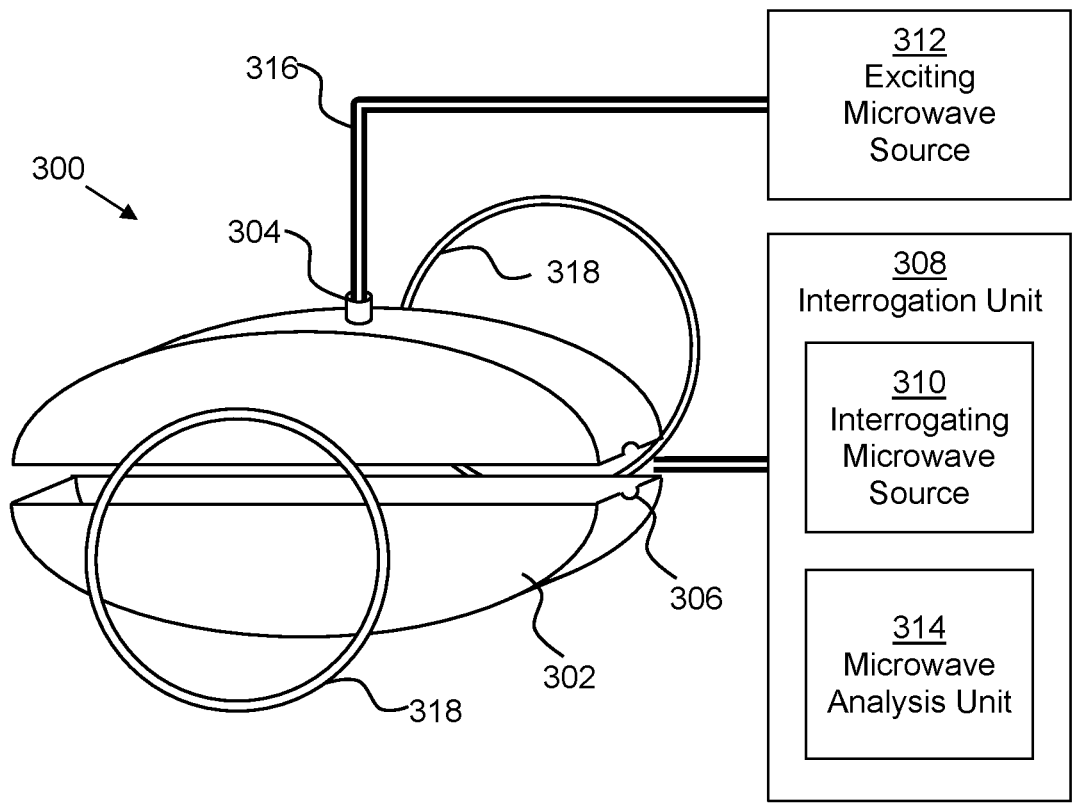
FIG. 3 is schematic diagram of a microwave resonance apparatus.

FIG. 3 shows a microwave resonance apparatus 300. The apparatus comprises a microwave cavity 302 with a first resonance mode at an exciting microwave frequency and a second resonance mode at an interrogation microwave frequency. The apparatus further comprises an interrogation unit 308, which comprises an interrogating microwave source 310. The apparatus also comprises an exciting microwave source 312. The interrogating microwave source and the exciting microwave source 312 are configured to excite the cavity at a first and second resonant mode of the cavity. In some examples the interrogating microwave source 310 and the exciting microwave source 312 are independent units. In other examples exciting and interrogating microwaves may be provided a single broadband source.

In this example, the interrogation unit 308 further comprises a microwave analysis unit 314. The second input 304 may be a waveguide port for connecting the cavity to the microwave analysis unit 314. The microwave analysis unit 314 is configured to measure absorption of microwave radiation at the second frequency.

Microwave radiation at the second frequency is input via a waveguide 316. Microwave radiation may also be output from the excited sample through the second input port through the waveguide 316 to the microwave analysis unit 314.

As described previously, waveguides may be associated with a cut-off frequency and will not transmit significant amounts of radiation with a frequency below the cut-off frequency. In this example, the dimensions of the cavity 302 and in this example, the waveguide 316 is selected such that the cut-off frequency of the waveguide 316 is greater than the first frequency and less than the second frequency.

This means that, if microwave radiation is input to the cavity at both the first and second frequency partially concurrently, the waveguide will act as a filter, filtering out the first frequency. For example a sample may be excited by inputting radiation at the first frequency and interrogated using radiation at the second frequency at least partially concurrently without radiation at the first frequency being transmitted by the waveguide 316 to the microwave analysis unit 314. The waveguide 316 passes radiation at the second frequency but acts like a high pass filter and limits radiation at the first frequency from interfering with the interrogation of the sample.

The cut-off frequency, $f_c$, of a hollow rectangular waveguide operating in the n, m mode can be determined by the following equation:

$$f_c = \frac{c}{2}\sqrt{\left(\frac{n}{x_n}\right)^2 + \left(\frac{m}{x_m}\right)^2}$$

where $x_n$ and $x_m$ are the cross sectional dimensions of the waveguide and c is the speed of light.

For example a rectangular waveguide designed to transmit X-band microwaves may have cross sectional dimensions 22.86 mm by 10.16 mm and have a recommended frequency band of operation of 8.20 GHz to 12.40 GHz, with a cut-off frequency of 6.56 GHz for the lowest order mode, $TE_{10}$.

In other examples, a separate filter may be provided. However, by arranging the modes to have a suitable separation and selecting a waveguide 316 with a cut off frequency between the first and second frequency, the waveguide 316 itself can act as a filter and no additional apparatus is required.

In some examples the second input port 306 is a coaxial input port configured to input exciting microwaves from the exciting microwave source to the microwave cavity. A coaxial input port can be easily adjusted to allow for the coupling to be adjusted to reduce reflected power.

In the example of FIG. 3, the cavity 302 is an elliptic cylinder. The resonant modes of an elliptic cylinder cavity are determined by the dimensions of the cavity. The difference in frequency between resonant modes may be varied by varying eccentricity of the ellipse. An elliptic cylinder of comparable dimensions to a rectangular cylinder can provide a greater difference in frequency between resonant modes suitable for exciting and interrogating a sample. For example an elliptic cylinder cavity with dimensions of 39.4 mm by 35.6 mm will have suitable resonances at frequencies 6.1 GHz and 9.6 GHz. The cavity may have a third dimension of around, for example, 10 mm, however this will not affect the resonant frequencies of interest.

Considering for example the rectangular cavity described previously above with $TE_{101}$ and $TE_{102}$ resonant modes at 7.3 GHz and 9.6 GHz respectively, if a standard X-band waveguide was used, for example as described above with a cut-off frequency of 6.56 GHz, radiation corresponding to both resonant modes would be transmitted by the waveguide. Therefore exciting radiation from the $TE_{101}$ mode at 7.3 GHz would be transmitted to the measurement apparatus and may interfere with the microwave analysis measurements. If the shape of the cavity was instead an ellipse, the cavity may have a resonant mode suitable for microwave analysis within the X-band, for example at 9.6 GHz, with a different resonant mode suitable for exciting at a wavelength below the cut-off frequency of the waveguide. In the other example rectangular cavity described above with $TE_{101}$ and $TE_{102}$ resonant modes at 6.1 GHz and 9.6 GHz respectively, the frequency of the $TE_{102}$ resonant mode is above the cut-off frequency and would therefore be transmitted and the frequency of the $TE_{101}$ resonant mode is below the cut-off frequency and would therefore not be transmitted by the waveguide.

In this example, the microwave resonance apparatus 300 further comprises a magnetic field source 318. The magnetic field source 318 may be a permanent magnet or may be an electromagnet. In some examples coils of conducting wire are used to provide a magnetic field. An electromagnet may provide a magnetic field that varies with time. For example the current supplied to electromagnet coils may be varied to provide a magnetic field that varies in strength. In other examples multiple electromagnets may be provided which can provide a field that varies in both strength and/or direction by coordinating time varying voltages supplied to the different coils.

The magnetic field source 318 may be configured for magnetic resonance spectroscopy. For example, for electron paramagnetic resonance spectroscopy, there may be two electromagnet coils to provide a uniform magnetic field in the cavity 302 which varies in strength with time. In other examples the magnetic field source 318 may provide a magnetic field for magnetic nanoparticle polarization analysis. For such an analysis a rotating magnetic field may be provided by four coils arranged around the cavity, each with a time varying voltage applied.

FIG. 3 shows a cavity which comprises two separable parts which are separable in a plane perpendicular to the ends of the elliptic cylinder (a 'clam shell' configuration). Although shown in FIG. 3 for an elliptic cylinder cavity, any shape cavity may be constructed to be separable in a similar manner, such that the cavity is separable into two parts. This construction may simplify construction and may also allow for easier access to a sample located within the cavity. Access to a sample may be useful for physical access to a sample or for interrogating a sample for example by using other non-microwave forms of radiation, for example visible light. Such interrogations may take place during irradiation of the cavity at the first frequency to excite the sample and/or during irradiation of the cavity at the second frequency to interrogate the sample.

Figure 4:
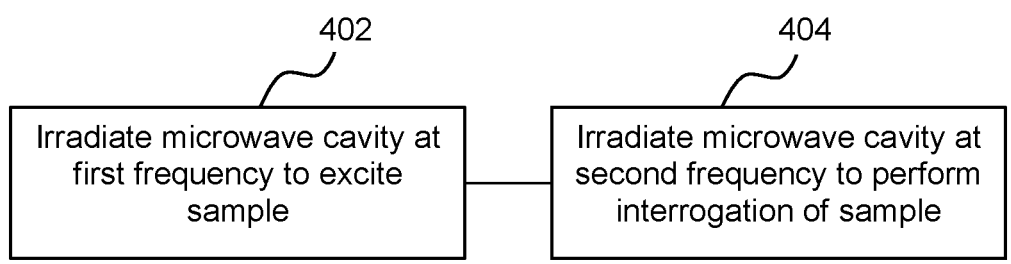
FIG. 4 is a flowchart of an example method of performing microwave analysis in a microwave resonance cavity.

FIG. 4 shows a method of performing microwave analysis in a microwave resonance cavity. In block 402 the microwave cavity is irradiated at a first frequency to excite the sample. In block 404 the cavity is irradiated at a second frequency to perform an interrogation a sample. The steps of irradiating the microwave resonance cavity to excite the sample and irradiating the microwave resonance cavity to perform an interrogation of the sample are carried out at least partially concurrently.

The microwave radiation at the first frequency may excite the cavity at mode having a maximum electric field at the location of the sample and the microwave radiation at the second frequency may excite the cavity at a mode having a maximum magnetic field at the location of the sample. The sample may be located in the centre of the cavity. The sample may be prepared in a glass tube such as an NMR tube or similar and inserted in to the cavity. The cavity may have an opening to insert a container containing the sample. In some examples the cavity may be separable into parts to allow access to the sample.

Microwave radiation at the first frequency may be input to the cavity through a first input port proximal to a maximum of the magnetic field at a resonant mode at the first frequency and microwave radiation may be input to the cavity through a second input port proximal to a maximum of the magnetic field at a resonant mode at the second frequency.

In the examples described above the analysis performed may be microwave resonance spectroscopy. The microwave resonance spectroscopy may for example comprise electron paramagnetic resonance spectroscopy or it may be nuclear magnetic resonance spectroscopy.

In other examples the method may comprise determining a change in polarization of the radiation of at the second frequency. This may be achieved by applying a polarizing filter to the radiation output from the cavity. The polarization state of the output radiation may vary with time and measurements of how the polarization changes may be used to determine properties of the sample.

In some examples the sample may be exposed to a rotating magnetic field. Such a field may induce a periodic variation in the polarization state of the radiation. If the sample comprises magnetic nanoparticles this effect may be enhanced. In a liquid comprising magnetic nanoparticles, rotation of the particles can be induced by applying a rotating magnetic field. The magnetic nanoparticles tend to align with an applied field and can act as a polarizer and so alter the polarization state of the radiation.

By measuring the change in absorption the rate of rotation of nanoparticles can be determined. The rate of rotation of the nanoparticles can provide information about the particles or the liquid in which they are contained. For example the dimensions of the particles, the material which they are made from or the viscosity of the liquid they are contained in may affect their movement when they are exposed to a time varying magnetic field.

Nanoparticles such as nano-rods may be configured or selected such that they bind with certain chemical or biological molecules such as amino acid sequences, nucleotides, nucleosides, DNA or RNA. When they bind to molecules it may affect their motion. For example nanoparticles which bind to large molecules may rotate more slowly. Therefore by measuring the rate of rotation of nanoparticles the presence of specific biological or chemical matter may be detected. Therefore such techniques may be useful in diagnostics or testing chemical or pharmaceutical samples.

To measure biological or chemical compounds it may be preferable to process the sample by exciting the sample, which may comprise heating the sample. For example biological samples may be heated to break down cells into their constituent components. Therefore the sample may be heated in the cavity by exciting the cavity at the first frequency to prepare the sample. The cavity may also be excited at the second frequency for analysis of the chemical or biological matter in the sample. In other examples the excitation may be non-thermal, for example an electroporation excitation, wherein genetic information is exchanged between the sample and its surroundings, triggered by microwaves of the excitation mode. In some examples, after excitation, there may be an incubation period (in some cases, of a few minutes) before analysis of the nanoparticles is carried out.

More generally, while in some methods of use of the apparatus described herein, excitation and analysis may be carried out at least partially concurrently, in other examples, these steps may be carried out at different times, for example with a delay between excitation and analysis (albeit that, in some examples, the sample may remain in the cavity during any incubation or delay between the steps).

While the method, apparatus and related aspects have been described with reference to certain examples, various modifications, changes, omissions, and substitutions can be made without departing from the spirit of the present disclosure. It is intended, therefore, that the method, apparatus and related aspects be limited only by the scope of the following claims and their equivalents. It should be noted that the above-mentioned examples illustrate rather than limit what is described herein, and that those skilled in the art will be able to design many alternative implementations without departing from the scope of the appended claims. Features described in relation to one example may be combined with features of another example.

The word "comprising" does not exclude the presence of elements other than those listed in a claim, "a" or "an" does not exclude a plurality, and features of the dependent claims may be combined in any practical combination.

The invention claimed is:

1. A microwave resonance cavity comprising:
   a first input port for inputting microwave radiation at a first frequency, the microwave radiation at the first frequency being to excite a sample in the microwave resonance cavity;
   a second input port comprising a waveguide configured to:
      input the microwave radiation at a second frequency in the microwave resonance cavity, the microwave radiation at the second frequency being to interrogate the sample in the microwave resonance cavity for analysis;
      transmit a microwave return signal from the microwave resonance cavity; and
      filter radiation at the first frequency from the microwave return signal;
   wherein the microwave resonance cavity has dimensions such that it resonates at both the first frequency and the second frequency;
   wherein the waveguide has a cut-off frequency greater than the first frequency and less than the second frequency.

2. The microwave resonance cavity of claim 1, wherein an excitation caused by the microwave radiation at the first frequency is heating.

3. The microwave resonance cavity of claim 1, wherein the microwave resonance cavity has a sample receiving region and is dimensioned such that:
   the microwave radiation at the first frequency results in a high electric field in the sample receiving region; and
   the microwave radiation at the second frequency results in a high magnetic field in the sample receiving region.

4. The microwave resonance cavity of claim 3, wherein the microwave resonance cavity is dimensioned such that the first frequency results in a $TE_{101}$ resonant mode and the second frequency results in a resonant $TE_{102}$ mode.

5. The microwave resonance cavity of claim 3, wherein the first input port is proximal to a maximum of the magnetic field of a resonant mode of the microwave radiation at the first frequency and the second input port is proximal to a maximum in the magnetic field of a resonant mode of the microwave radiation at the second frequency.

6. The microwave resonance cavity of 1, wherein the waveguide connects the microwave resonance cavity to a microwave analysis unit.

7. The microwave resonance cavity of claim 1, wherein the second input port is further configured to receive radiation output by the excited sample.

8. The microwave resonance cavity of claim 1, wherein the first input port is a coaxial input port.

9. The microwave resonance cavity of claim 1, wherein the microwave resonance cavity is an elliptic cylinder.

10. The microwave resonance cavity of claim 9, wherein the elliptic cylinder comprises first and second ends and the microwave resonance cavity comprises two separable parts, the parts separable in a plane perpendicular to the ends of the elliptic cylinder.

11. The microwave resonance cavity of claim 9, wherein the elliptic cylinder is dimensioned such that the second frequency is an X-band microwave frequency.

12. A method of performing microwave analysis in a microwave resonance cavity comprising:
   irradiating the microwave resonance cavity at a first frequency to excite a sample;
   irradiating the microwave resonance cavity at a second frequency to perform an interrogation of the sample;
   transmitting a microwave return signal from the microwave resonance cavity; and
   filtering radiation at the first frequency from the microwave return signal;
   wherein the steps of irradiating the microwave resonance cavity to excite the sample and irradiating the microwave resonance cavity to perform an interrogation of the sample are carried out at least partially concurrently.

13. The method of claim 12, wherein:
the first frequency excites the microwave resonance cavity at a mode having a maximum electric field at a location of the sample; and
the second frequency excites the microwave resonance cavity at a mode having a maximum magnetic field at the location of the sample.

14. The method of claim 12, wherein performing a microwave radiation absorption analysis comprises measuring an electron paramagnetic resonance spectrum.

15. The method of claim 12, further comprising performing microwave resonance spectroscopy of the sample.

16. The method of claim 15, wherein the microwave resonance spectroscopy is one of electron paramagnetic resonance spectroscopy and nuclear magnetic resonance spectroscopy.

17. The method of claim 12, further comprising determining a change in absorption of the radiation at the second frequency.

18. The method of claim 12, further comprising applying a rotating magnetic field to the sample.

19. The method of claim 12, wherein the sample comprises magnetic nanoparticles.

20. The method of 17, further comprising determining a rate of rotation of nanoparticles in the sample based on the determined change in absorption.

21. The method of claim 20, further comprising determining a presence of specific biological matter in the sample based on the rate of rotation of the nanoparticles.

22. A microwave resonance apparatus comprising:
a microwave resonance cavity with a first resonance mode at an exciting microwave frequency and a second resonance mode at an interrogating microwave frequency;
an interrogation unit comprising an interrogating microwave source and a microwave analysis unit;
an exciting microwave source; and
a waveguide with a cut-off frequency greater than the exciting microwave frequency and less than the interrogating microwave frequency, and configured to:
input microwave radiation at the interrogating microwave frequency to the microwave resonance cavity;
transmit a microwave return signal from the microwave resonance cavity to the microwave analysis unit;
filter radiation at the exciting microwave frequency from the microwave return signal; and
wherein the interrogating microwave source and the exciting microwave source are configured to excite the microwave resonance cavity at a first and second resonant mode of the microwave resonance cavity respectively.

* * * * *